(12) United States Patent
Wang et al.

(10) Patent No.: US 12,550,651 B2
(45) Date of Patent: Feb. 10, 2026

(54) SELECTIVE ETCHING OF SILICON-CONTAINING MATERIAL RELATIVE TO METAL-DOPED BORON FILMS

(71) Applicant: Applied Materials, Inc., Santa Clara, CA (US)

(72) Inventors: Han Wang, Sunnyvale, CA (US); Yu Yang, Sunnyvale, CA (US); Jing Zhang, Santa Clara, CA (US); Aykut Aydin, Sunnyvale, CA (US); Guoqing Li, Santa Clara, CA (US); Guangyan Zhong, Sunnyvale, CA (US); Rui Cheng, San Jose, CA (US); Gene H. Lee, San Jose, CA (US); Srinivas Guggilla, San Jose, CA (US); Sinae Heo, Santa Clara, CA (US); Eswaranand Venkatasubramanian, Santa Clara, CA (US); Abhijit Basu Mallick, Sunnyvale, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 385 days.

(21) Appl. No.: 18/106,697

(22) Filed: Feb. 7, 2023

(65) Prior Publication Data
US 2024/0266185 A1 Aug. 8, 2024

(51) Int. Cl.
*H01L 21/311* (2006.01)
*H01L 21/033* (2006.01)

(52) U.S. Cl.
CPC .... *H01L 21/31144* (2013.01); *H01L 21/0332* (2013.01)

(58) Field of Classification Search
CPC ............ H01L 21/0332; H01L 21/0276; H01L 21/0337; H01L 21/32139; H01L 21/31122
See application file for complete search history.

(56) References Cited

U.S. PATENT DOCUMENTS

| 2017/0092505 A1 | 3/2017 | Nakao et al. |
| 2017/0207087 A1 | 7/2017 | Roy et al. |

(Continued)

OTHER PUBLICATIONS

Application No. PCT/US2024/012381, International Search Report and Written Opinion, Mailed On May 23, 2024, 11 pages.

*Primary Examiner* — Karen Kusumakar
(74) *Attorney, Agent, or Firm* — Kilpatrick Townsend & Stockton LLP

(57) ABSTRACT

Exemplary semiconductor processing methods may include depositing a metal-doped boron-containing material on a substrate disposed within a processing region of a semiconductor processing chamber. The metal-doped boron-containing material may include a metal dopant comprising tungsten. The substrate may include a silicon-containing material. The methods may include depositing one or more additional materials over the metal-doped boron-containing material. The one or more additional materials may include a patterned photoresist material. The methods may include transferring a pattern from the patterned photoresist material to the metal-doped boron-containing material. The methods may include etching the metal-doped boron-containing material with a chlorine-containing precursor. The methods may include etching the silicon-containing material with a fluorine-containing precursor. The metal dopant may enhance an etch rate of the silicon-containing material. The methods may include removing the metal-doped boron-containing material from the substrate with a halogen-containing precursor.

15 Claims, 5 Drawing Sheets

(56) References Cited

U.S. PATENT DOCUMENTS

| | | | |
|---|---|---|---|
| 2018/0337047 A1* | 11/2018 | Fung | H01L 21/0337 |
| 2020/0075341 A1 | 3/2020 | Matsubara et al. | |
| 2020/0285144 A1* | 9/2020 | Maeda | G01N 23/2258 |
| 2022/0341034 A1 | 10/2022 | Aydin et al. | |
| 2022/0367186 A1 | 11/2022 | Fung et al. | |
| 2023/0377956 A1* | 11/2023 | Chen | H01L 21/31144 |

* cited by examiner

SELECTIVE ETCHING OF SILICON-CONTAINING MATERIAL RELATIVE TO METAL-DOPED BORON FILMS

TECHNICAL FIELD

The present technology relates to semiconductor deposition and etch processes. More specifically, the present technology relates to methods of utilizing materials with metal dopants as masking materials to increase etch rate of underlying material and/or selectivity to underlying material during patterning operations.

BACKGROUND

Integrated circuits are made possible by processes which produce intricately patterned material layers on substrate surfaces. Producing patterned structures on a substrate requires controlled methods of formation and removal of exposed material. As device sizes continue to shrink, and structures become more complex, material properties may affect subsequent operations. For example, masking materials may affect both the ability to develop structures as well as the ability to selectively remove materials.

Thus, there is a need for improved systems and methods that can be used to produce high quality devices and structures. These and other needs are addressed by the present technology.

SUMMARY

Exemplary semiconductor processing methods may include depositing a metal-doped boron-containing material on a substrate disposed within a processing region of a semiconductor processing chamber. The metal-doped boron-containing material may include a metal dopant comprising tungsten. The substrate may include a silicon-containing material. The methods may include depositing one or more additional materials over the metal-doped boron-containing material. The one or more additional materials may include a patterned photoresist material. The methods may include transferring a pattern from the patterned photoresist material to the metal-doped boron-containing material. The methods may include etching the metal-doped boron-containing material with a chlorine-containing precursor. The methods may include etching the silicon-containing material with a fluorine-containing precursor. The metal dopant may enhance an etch rate of the silicon-containing material. The methods may include removing the metal-doped boron-containing material from the substrate with a halogen-containing precursor.

In some embodiments, a metal dopant concentration within the metal-doped boron-containing material may be maintained at less than or about 80 at. %. The one or more additional materials may include an oxide hardmask deposited over the metal-doped boron-containing material, a carbon hardmask deposited over the oxide hardmask, and one or more anti-reflective coatings deposited over the carbon hardmask. The patterned photoresist material may overly the one or more anti-reflective coatings. The chlorine-containing precursor may be or include diatomic chlorine ($Cl_2$). The methods may include, during etching of the metal-doped boron-containing material, applying a plasma power to the processing region. The methods may include, during etching of the metal-doped boron-containing material, intermittently delivering a silicon-containing precursor and an oxygen-containing precursor to form a passivation material on sidewalls of the metal-doped boron-containing material. The silicon-containing precursor may be or include silicon tetrachloride ($SiCl_4$). The oxygen-containing precursor may be or include molecular oxygen ($O_2$). The fluorine-containing precursor may be or include a fluorocarbon. The metal dopant may facilitate fluorine radical formation during etching of the silicon-containing material. The halogen-containing precursor may be or include diatomic chlorine ($Cl_2$) or hydrogen bromide (HBr).

Some embodiments of the present technology encompass semiconductor structures. The structures may include a substrate. The structures may include a silicon-and-oxygen material overlying the substrate. The structures may include a silicon-carbon-and-nitrogen material overlying the silicon-and-oxygen material. The structures may include a metal-doped boron-containing material overlying the silicon-carbon-and-nitrogen material. The metal-doped boron-containing material may include a metal dopant comprising tungsten. The structures may include one or more additional materials overlying the metal-doped boron-containing material.

The one or more additional materials may include a patterned photoresist material.

In some embodiments, the one or more additional materials may include an oxide hardmask overlying the metal-doped boron-containing material, a carbon hardmask overlying the oxide hardmask, and one or more anti-reflective coatings overlying the carbon hardmask. The patterned photoresist material may overly the one or more anti-reflective coatings. A metal dopant concentration within the metal-doped boron-containing material may be maintained at less than or about 80 at. %. The metal-doped boron-containing material may be characterized by a hardness of greater than or about 25 GPa. A thickness of the silicon-and-oxygen material may be greater than a thickness of the metal-doped boron-containing material.

Some embodiments of the present technology encompass semiconductor processing method. The methods may include depositing a metal-doped boron-containing material over a silicon-containing material overlying a substrate disposed within a processing region of a semiconductor processing chamber. The metal-doped boron-containing material may include a metal. The methods may include delivering a fluorine-containing precursor and an oxygen-containing precursor to the processing region of the semiconductor processing chamber. The methods may include forming a plasma of the fluorine-containing precursor and the oxygen-containing precursor within the processing region of the semiconductor processing chamber. The methods may include etching the silicon-containing material. The etching may remove a portion of the metal-doped boron-containing material. The metal may increase an etch rate of the silicon-containing material.

In some embodiments, the metal-doped boron-containing material may further include one or more of tungsten, molybdenum, titanium, aluminum, cobalt, ruthenium, tantalum, hafnium, zirconium, silicon, carbon, or nitrogen. The methods may include depositing a photoresist material over the metal-doped boron-containing material. The methods may include patterning the photoresist material. The methods may include transferring a pattern from the patterned photoresist material to the metal-doped boron-containing material. The fluorine-containing precursor may be or include a fluorocarbon. The fluorine-containing precursor may passivate sidewalls of the metal-doped boron-containing material.

Such technology may provide numerous benefits over conventional systems and techniques. For example, the processes may produce films characterized by improved selectivity relative to underlying materials. Additionally, the operations of embodiments of the present technology may produce improved mask materials that may facilitate processing operations. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

During semiconductor fabrication, structures may be produced on a substrate utilizing a variety of deposition and etching operations. Mask materials may be used to allow materials to be at least partially etched to produce features across the substrate. As device sizes continue to reduce, and improved selectivity between materials may ease structural formation, utilizing improved hard masks may facilitate fabrication. For example, future DRAM nodes may require taller capacitor structures, which may involve forming deeper trenches on a substrate. Conventional hardmasks may reach a limitation in selectivity relative to underlying silicon materials. Accordingly, many semiconductor fabrication processes are utilizing thicker hardmask films for larger vertical device structures, or attempting to develop mask materials characterized by increased hardness. However, while a hardmask may be characterized by a sufficient transparency at one thickness, as the thickness increases, the film may become less transparent. When a film becomes sufficiently opaque, processes may require additional operations to open areas near alignment markers to ensure correct orientation. Additionally, thicker hard mask films may challenge patterning, which may in turn affect uniformity of transfer into the underlying structure.

The present technology may overcome these limitations by producing mask materials that incorporate metal dopants. Although these materials may counterintuitively reduce transparency and hardness, the materials may be more selective to underlying materials, which may afford reduced thickness masks, and which overall may improve etching and structural formation in semiconductor substrates. It is to be understood that the present technology is not intended to be limited to the specific films and processing discussed, as the techniques described may be used to improve a number of film formation processes, and may be applicable to a variety of processing chambers and operations.

Figure 1:
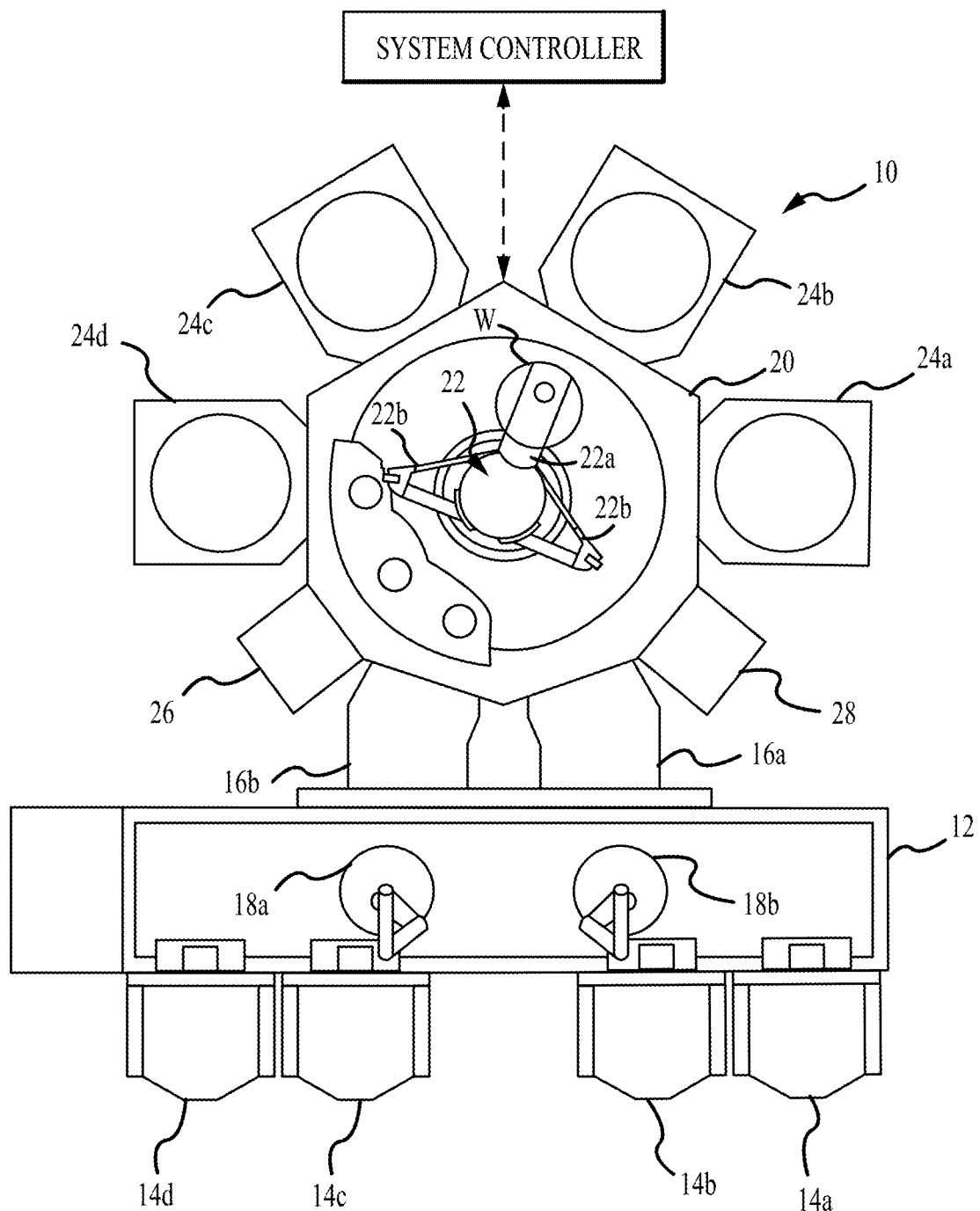
FIG. 1 shows a schematic top plan view of an exemplary processing system according to some embodiments of the present technology.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
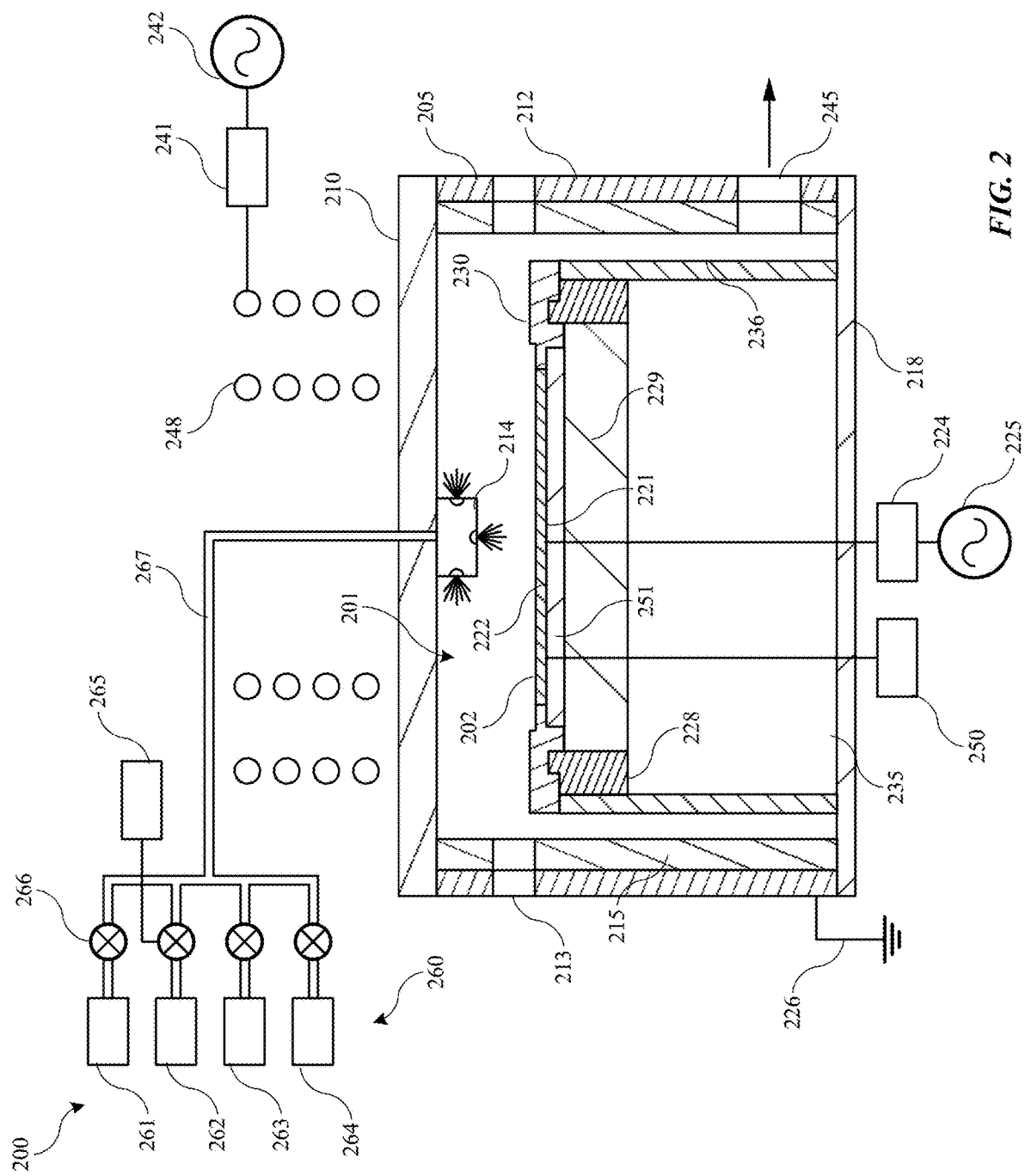
FIG. 2 shows a schematic cross-sectional view of an exemplary processing system according to some embodiments of the present technology.

FIG. 2 illustrates a schematic cross-sectional view of an exemplary processing chamber 200 suitable for patterning a material layer disposed on a substrate 202 in the processing chamber 200. The exemplary processing chamber 200 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 200 may include a chamber body 205 defining a chamber volume 201 in which a substrate may be processed. The chamber body 205 may have sidewalls 212 and a bottom 218 which are coupled with ground 226. The sidewalls 212 may have a liner 215 to protect the sidewalls 212 and extend the time between maintenance cycles of the plasma processing chamber 200. The dimensions of the chamber body 205 and related components of the plasma processing chamber 200 are not limited and generally may be proportionally larger than the size of the substrate 202 to be processed therein. Examples of substrate sizes include 200 mm diameter, 250 mm diameter, 300 mm diameter and 450 mm diameter, among others, such as display or solar cell substrates as well.

The chamber body 205 may support a chamber lid assembly 210 to enclose the chamber volume 201. The chamber body 205 may be fabricated from aluminum or other suitable materials. A substrate access port 213 may be formed through the sidewall 212 of the chamber body 205, facilitating the transfer of the substrate 202 into and out of the plasma processing chamber 200. The access port 213 may be coupled with a transfer chamber and/or other chambers of a substrate processing system as previously described. A pumping port 245 may be formed through the sidewall 212 of the chamber body 205 and connected to the chamber volume 201. A pumping device may be coupled through the pumping port 245 to the chamber volume 201 to evacuate and control the pressure within the processing volume. The pumping device may include one or more pumps and throttle valves.

A gas panel 260 may be coupled by a gas line 267 with the chamber body 205 to supply process gases into the chamber volume 201. The gas panel 260 may include one or more process gas sources 261, 262, 263, 264 and may additionally include inert gases, non-reactive gases, and reactive gases, as may be utilized for any number of processes. Examples of process gases that may be provided by the gas panel 260 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, silicon and hydrogen containing gases such as $BCl_3$, $Cl_2$, $SiCl_4$, $CF_4$, $C_2F_4$, $C_4F_8$, $C_4F_6$, $CHF_3$, $CH_2F_2$, $CH_3F$, $NF_3$, $NH_3$, $CO_2$, $SO_2$, $CO$, $COS$, $N_2$, $NO_2$, $N_2O$, $O_2$, $HBr$, and $H_2$, among any number of additional precursors.

Valves 266 may control the flow of the process gases from the sources 261, 262, 263, 264 from the gas panel 260 and may be managed by a controller 265. The flow of the gases supplied to the chamber body 205 from the gas panel 260 may include combinations of the gases form one or more sources. The lid assembly 210 may include a nozzle 214. The nozzle 214 may be one or more ports for introducing the process gases from the sources 261, 262, 264, 263 of the gas panel 260 into the chamber volume 201. After the process gases are introduced into the plasma processing chamber 200, the gases may be energized to form plasma. An antenna 248, such as one or more inductor coils, may be provided adjacent to the plasma processing chamber 200. An antenna power supply 242 may power the antenna 248 through a match circuit 241 to inductively couple energy, such as RF energy, to the process gas to maintain a plasma formed from the process gas in the chamber volume 201 of the plasma processing chamber 200. Alternatively, or in addition to the antenna power supply 242, process electrodes below the substrate 202 and/or above the substrate 202 may be used to capacitively couple RF power to the process gases to maintain the plasma within the chamber volume 201. The operation of the power supply 242 may be controlled by a controller, such as controller 265, that also controls the operation of other components in the plasma processing chamber 200.

A substrate support pedestal 235 may be disposed in the chamber volume 201 to support the substrate 202 during processing. The substrate support pedestal 235 may include an electrostatic chuck 222 for holding the substrate 202 during processing. The electrostatic chuck ("ESC") 222 may use the electrostatic attraction to hold the substrate 202 to the substrate support pedestal 235. The ESC 222 may be powered by an RF power supply 225 integrated with a match circuit 224. The ESC 222 may include an electrode 221 embedded within a dielectric body. The electrode 221 may be coupled with the RF power supply 225 and may provide a bias which attracts plasma ions, formed by the process gases in the chamber volume 201, to the ESC 222 and substrate 202 seated on the pedestal. The RF power supply 225 may cycle on and off, or pulse, during processing of the substrate 202. The ESC 222 may have an isolator 228 for the purpose of making the sidewall of the ESC 222 less attractive to the plasma to prolong the maintenance life cycle of the ESC 222. Additionally, the substrate support pedestal 235 may have a cathode liner 236 to protect the sidewalls of the substrate support pedestal 235 from the plasma gases and to extend the time between maintenance of the plasma processing chamber 200.

Electrode 221 may be coupled with a power source 250. The power source 250 may provide a chucking voltage of about 200 volts to about 2000 volts to the electrode 221. The power source 250 may also include a system controller for controlling the operation of the electrode 221 by directing a DC current to the electrode 221 for chucking and de-chucking the substrate 202. The ESC 222 may include heaters disposed within the pedestal and connected to a power source for heating the substrate, while a cooling base 229 supporting the ESC 222 may include conduits for circulating a heat transfer fluid to maintain a temperature of the ESC 222 and substrate 202 disposed thereon. The ESC 222 may be configured to perform in the temperature range required by the thermal budget of the device being fabricated on the substrate 202. For example, the ESC 222 may be configured to maintain the substrate 202 at a temperature of about −150° C. or lower to about 500° C. or higher depending on the process being performed.

The cooling base 229 may be provided to assist in controlling the temperature of the substrate 202. To mitigate process drift and time, the temperature of the substrate 202 may be maintained substantially constant by the cooling base 229 throughout the time the substrate 202 is in the chamber. In some embodiments, the temperature of the substrate 202 may be maintained throughout subsequent processes at temperatures between about −150° C. and about 500° C., although any temperatures may be utilized. A cover ring 230 may be disposed on the ESC 222 and along the periphery of the substrate support pedestal 235. The cover ring 230 may be configured to confine etching gases to a desired portion of the exposed top surface of the substrate 202, while shielding the top surface of the substrate support pedestal 235 from the plasma environment inside the plasma processing chamber 200. Lift pins may be selectively translated through the substrate support pedestal 235 to lift the substrate 202 above the substrate support pedestal 235 to facilitate access to the substrate 202 by a transfer robot or other suitable transfer mechanism as previously described.

The controller 265 may be utilized to control the process sequence, regulating the gas flows from the gas panel 260 into the plasma processing chamber 200, and other process parameters. Software routines, when executed by the CPU, transform the CPU into a specific purpose computer such as a controller, which may control the plasma processing chamber 200 such that the processes are performed in accordance with the present disclosure. The software routines may also be stored and/or executed by a second controller that may be associated with the plasma processing chamber 200.

Figure 3:
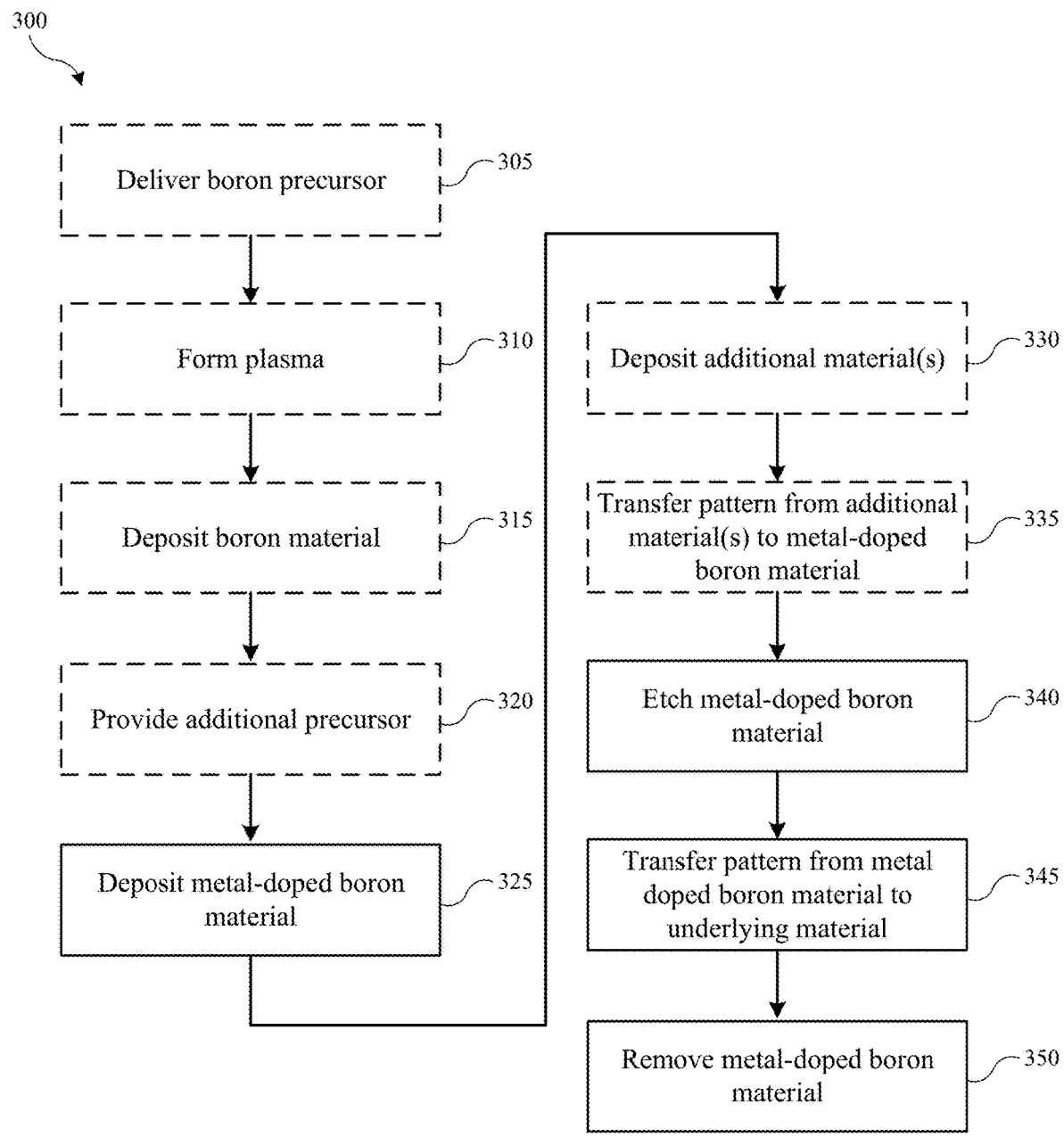
FIG. 3 shows exemplary operations in a semiconductor processing method according to some embodiments of the present technology.

FIG. 3 shows exemplary operations in a deposition method 300 according to some embodiments of the present technology. The method may be performed in a variety of processing chambers, including any one of processing chambers 24a-d and/or processing chamber 200 described above. Method 300 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 300 may describe operations shown schematically in FIGS. 4A-4E, the illustrations of which will be described in conjunction with the operations of method 300. It is to be understood that the figures illustrate only partial schematic views, and a substrate may contain any number of additional materials and features having a variety of characteristics and aspects as illustrated in the figures.

Method 300 may include additional operations prior to initiation of the listed operations. For example, additional processing operations may include forming structures on a substrate, which may include both forming and removing material. Prior processing operations may be performed in the chamber in which method 300 may be performed, or processing may be performed in one or more other processing chambers prior to delivering the substrate into the semiconductor processing chamber in which method 300 may be performed. Regardless, method 300 may optionally include delivering a substrate to a processing region of a semiconductor processing chamber, such as processing chambers 24a-d or processing chamber 200 described above, or other chambers that may include components as described above. The substrate may be deposited on a substrate support, which may be a pedestal, and which may reside in a processing region of the chamber.

Figure 4A:
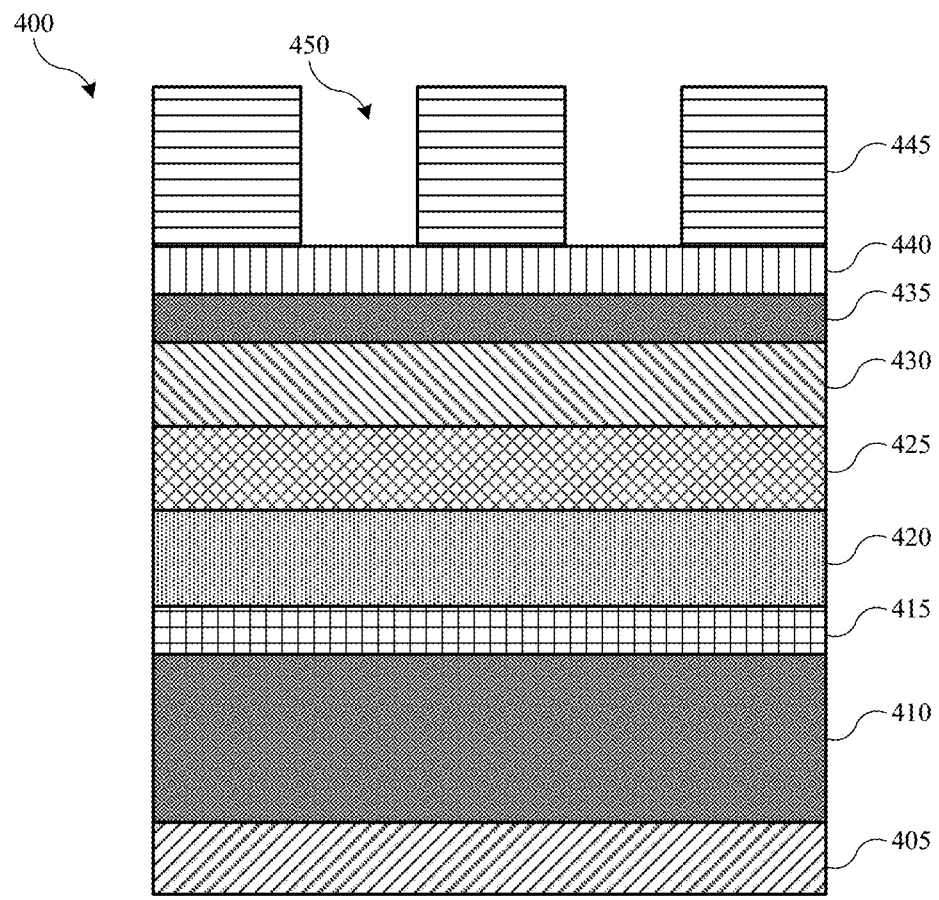
FIGS. 4A-4E illustrate schematic cross-sectional views of substrate materials on which selected operations are being performed according to some embodiments of the present technology.

As illustrated in FIG. 4A, the substrate 405 may be or include any number of materials on which materials may be deposited. The substrate 405 may be or include silicon, germanium, dielectric materials including silicon oxide or silicon nitride, metal materials, or any number of combinations of these materials, which may be the substrate 405, or materials formed on the substrate 405. In some embodiments optional treatment operations, such as a pretreatment, may be performed to prepare a surface of the substrate 405 for deposition. For example, a pretreatment may be performed to provide certain ligand terminations on the surface of the substrate 405, and which may facilitate nucleation of a film to be deposited. For example, hydrogen, oxygen, carbon, nitrogen, or other molecular terminations, including any combination of these atoms or radicals, may be adsorbed, reacted, or formed on a surface of the substrate 405. Additionally, material removal may be performed, such as reduction of native oxides or etching of material, or any other operation that may prepare one or more exposed surfaces of the substrate 405 for deposition.

At optional operation 305, one or more precursors may be delivered to the processing region of the chamber. For example, the film being deposited may be a mask film used in semiconductor processing. The deposition precursors may include any number of mask precursors, including one or more boron-containing precursors. The precursors may be flowed together or separately. For example, in exemplary embodiments in which a boron-containing film may be formed, at least one boron-containing precursor may be delivered to the processing region of the processing chamber. Plasma enhanced deposition may be performed in some embodiments of the present technology, which may facilitate material reactions and deposition. For example, at optional operation 310, a plasma may be formed of the boron-containing precursors, and a boron-containing material may be deposited at optional operation 315.

Boron-containing hardmasks may be characterized by desirable mechanical properties, such as relatively high Young's modulus and hardness, which may improve etch selectivity. However, to further improve etch selectivity over underlying silicon-containing materials, such as silicon oxide or silicon nitride, the present technology may incorporate one or more dopant materials, which may include one or more metals. Incorporating a metal may be counterintuitive in hard mask formation, especially with a goal of increasing properties for selective etching. For example, incorporating a metal into the hard mask may actually reduce film hardness, which many conventional technologies may avoid as they seek harder mask films. Additionally, metal dopants may reduce film transparency, which may challenge lithography operations by producing a more opaque film, challenging mask thicknesses that may be increased as used conventionally. However, the present technology utilizes metal dopants to increase selectivity of etch operations, which may overcome reductions in film hardness. Additionally, because the selectivity of etching may be improved compared to non-metal doped films, masks according to some embodiments of the present technology may be characterized by reduced thickness, which may improve film transparency. For example, as conventional technologies seek to increase depth of structures formed, a thicker hard mask may be provided. As silicon, boron, and germanium films increase in thickness, they may be characterized by a greater opaque nature, which may challenge lithography. By incorporating metal materials, the present technology may reverse this need for thicker mask films.

Accordingly, some embodiments of the present technology may include additionally providing a dopant-containing precursor at optional operation 320, and which is provided with the other deposition precursors. The precursors delivered may all be used to form a plasma within the processing region of the semiconductor processing chamber at operation 310 as explained above, and thus the order of operations as shown in method 300 may include operations occurring in different orders, including concurrently. At operation 325, a material may be deposited on the substrate 405 that includes the metal dopant within the deposited material, such as a metal-doped boron-containing material 420. In embodiments the metal-doped boron-containing material 420 may be formed over a silicon-containing material 410, such as silicon oxide or silicon nitride. In some embodiments, a silicon-carbon-and-nitrogen-containing material 415 may overly the silicon-containing material 410, and the metal-doped boron-containing material 420 may be formed over the silicon-carbon-and-nitrogen-containing material 415. By incorporating the dopant-containing precursor in some embodiments, selectivity of etching relative to the underlying silicon-containing material 410 and/or the silicon-carbon-and-nitrogen-containing material 415, if present, may be increased, while producing a film with controlled hardness and transparency.

Depending on the precursors used, a flow rate of the dopant precursor may be used to control incorporation of the dopant. For example, such as for a transition-metal dopant, while the flow rates of the other deposition precursors may be hundreds of sccm or more, the dopant precursor may be flowed at a flow rate less than or about 250 sccm, and may be delivered at a flow rate less than or about 200 sccm, less than or about 150 sccm, less than or about 100 sccm, less than or about 50 sccm, less than or about 40 sccm, less than or about 30 sccm, less than or about 25 sccm, less than or about 20 sccm, less than or about 15 sccm, less than or about 10 sccm, less than or about 5 sccm, or less.

Any number of precursors may be used with the present technology with regard to the boron-containing precursor. For example, boron-containing materials may include boranes, such as borane, diborane, or other multicenter-bonded boron materials, as well as any other boron-containing materials that may be used to produce boron-containing materials. The boron incorporation in the produced film may be based on any percentage incorporation. For example, the produced film may include greater than or about 20 at. % boron incorporation, and in some embodiments may include greater than or about 25 at. % boron incorporation, greater than or about 30 at. % boron incorporation, greater than or about 35 at. % boron incorporation, greater than or about 40 at. % boron incorporation, greater than or about 45 at. % boron incorporation, greater than or about 50 at. % boron incorporation, greater than or about 55 at. % boron incorporation, greater than or about 60 at. % boron incorporation, greater than or about 65 at. % boron incorporation, greater than or about 70 at. % boron incorporation, or greater, including a film that is substantially or essentially boron, less the amount of dopant within the film. Although trace materials from exposure to atmosphere or other process environments may be incorporated within the film, it is to be understood that the film may still be essentially boron-based in nature.

The dopant precursors may include any metal-containing precursor, such as including any metal or transition metal that may be delivered to the processing region in a stable form. Exemplary dopants may include one or more of tungsten, molybdenum, titanium, aluminum, cobalt, ruthenium, tantalum, hafnium, zirconium or any other metal or transition metal that may be incorporated with boron in a mask material. Dopant precursors may also additionally or alternatively include one or more of silicon, carbon, or nitrogen. Exemplary precursors may include any number of metal-containing materials, which may be dissociated in plasma to provide the metal dopant for incorporation. For example, non-limiting examples of dopant-containing precursors that may be used in embodiments of the present technology may include tungsten hexafluoride, tungsten hexacarbonyl, molybdenum hexafluoride, molybdenum pentachloride, molybdenum hexacarbonyl, titanium tetrachloride, tetrakis(dimethylamido)titanium, titanium tetrafluoride, trimethylaluminum, aluminum chloride, Bis(N,N'-diisopropylacetamidinato)cobalt, cobaltocene, Bis(ethylcyclopentadienyl)cobalt, Bis(pentamethylcyclopentadienyl)cobalt, Bis(cyclopentadienyl)ruthenium, Bis(ethylcyclopentadienyl)ruthenium, tantalum pentachloride, Pentakis(dimethylamido)tantalum, or any other metal-containing precursor that may be used to provide a metal dopant material for incorporation in a boron-containing material.

In some embodiments, the metal-doped boron-containing material 420 deposited may substantially or essentially consist of boron and one or more of the metal dopant materials. Additionally, in some embodiments along with the metal-containing precursor, an additional dopant precursor may be delivered that may include oxygen or nitrogen, or any other dopant that may adjust the structure of the deposited film to improve transparency, stress, hardness, as well as thermal resistance. Any number of nitrogen-containing precursors or oxygen-containing precursors may be used in embodiments of the present technology. Additionally, combination precursors may be used that include multiple of these elements. For example, an oxygen-containing precursor used in some embodiments may be nitrous oxide, which may provide both oxygen and nitrogen for incorporation within the film. The dopant incorporation may be within any range, which may be related to an extinction coefficient, where the higher the dopant incorporation, the lower the extinction coefficient of the formed film. In some embodiments, the dopant may be selected for compatibility with the other deposition precursors.

The dopant or dopants may be included in any amount or concentration, and may each or collectively be included at greater than or about 0.5 at. % in the deposited film, and in some embodiments may be included at greater than or about 1 at. %, greater than or about 2 at. %, greater than or about 3 at. %, greater than or about 4 at. %, greater than or about 5 at. %, greater than or about 6 at. %, greater than or about 7 at. %, greater than or about 8 at. %, greater than or about 9 at. %, greater than or about 10 at. %, greater than or about 11 at. %, greater than or about 12 at. %, greater than or about 13 at. %, greater than or about 14 at. %, greater than or about 15 at. %, greater than or about 16 at. %, greater than or about 17 at. %, greater than or about 18 at. %, greater than or about 19 at. %, greater than or about 20 at. %, greater than or about 30 at. %, greater than or about 40 at. %, greater than or about 50 at. %, greater than or about 60 at. %, greater than or about 70 at. %, greater than or about 80 at. %, or more. However, as explained above, metal dopants may reduce transparency as well as hardness, and thus in some embodiments the metal dopant concentration may be maintained at less than or about 80 at. %, less than or about 70 at. %, less than or about 60 at. %, less than or about 50 at. %, less than or about 40 at. %, less than or about 30 at. %, less than or about 20 at. %, less than or about 15 at. %, less than or about 12 at. %, less than or about 10 at. %, or less. Oxygen and/or nitrogen dopants may similarly be maintained at levels within these ranges as noted, which may further tune film characteristics. Although oxygen and/or nitrogen incorporation may facilitate improvements in extinction coefficient or film stress, the materials may reduce etch selectivity. Accordingly, incorporation of oxygen and nitrogen may be limited or excluded to maintain higher etch selectivity. In embodiments, a carbon precursor may be included in the deposition precursors to maintain higher etch selectivity. An additional hydrogen precursor, such as diatomic hydrogen, may be included in the deposition precursors, which may affect film transparency. Additionally, one or more carrier gases may be delivered, such as argon, to facilitate the deposition operations.

The temperatures of the substrate 405 may additionally impact the deposition. For example, in some embodiments during deposition, the substrate 405 may be maintained at a temperature of greater than or about 300° C., and may be maintained at a temperature of greater than or about 325° C., greater than or about 350° C., greater than or about 375° C., greater than or about 400° C., greater than or about 425° C., greater than or about 450° C., greater than or about 475° C., greater than or about 500° C., greater than or about 525° C., greater than or about 550° C., greater than or about 575° C., greater than or about 600° C., or greater. By performing the deposition according to some embodiments of the present technology, hydrogen may be reduced or limited within the film. Increased hydrogen incorporation may increase a compressive stress within the film, and thus films according to embodiments of the present technology may be characterized by a more tensile nature due to lower hydrogen incorporation. Additionally, in some embodiments, method 300 may include operations that may further reduce hydrogen incorporation in the film. Unlike some conventional technologies, by incorporating dopants according to embodiments of the present technology, damage from subsequent processing may be reduced or limited, such as by performing a thermal anneal subsequent deposition of the hard mask material in some embodiments.

As noted above, the present technology may increase selectivity of hard mask films, while limiting a loss in hardness. For example, metal-doped boron-containing materials 420 according to some embodiments of the present technology may be characterized by a film hardness that is maintained at greater than or about 20 GPa, and may be maintained at greater than or about 22 GPa, greater than or about 24 GPa, greater than or about 26 GPa, greater than or about 28 GPa, greater than or about 30 GPa, greater than or about 32 GPa, greater than or about 34 GPa, greater than or about 36 GPa, greater than or about 38 GPa, greater than or about 40 GPa, greater than or about 42 GPa, greater than or about 44 GPa, or more, despite incorporation of some metal materials that may reduce film hardness. Additionally, the film may have increased selectivity during a subsequent etching operation. For example, in some embodiments, method 300 may additionally include an operation to etch materials on the substrate 405 as further described below.

Metal-doped boron-containing hardmask films according to some embodiments of the present technology may be characterized by extinction coefficients for light at different wavelengths, which may impact lithography operations if performed. By controlling dopant incorporation to limit mask thickness according to embodiments of the present technology, including by adding oxygen and/or nitrogen dopants, extinction coefficients at 633 nm may be reduced to below or about 0.45, and may be reduced to less than or about 0.44, less than or about 0.43, less than or about 0.42, less than or about 0.41, less than or about 0.40, less than or about 0.39, less than or about 0.38, less than or about 0.37, less than or about 0.36, less than or about 0.35, less than or about 0.34, less than or about 0.33, less than or about 0.32, less than or about 0.31, less than or about 0.30, less than or about 0.29, less than or about 0.28, less than or about 0.27, less than or about 0.26, less than or about 0.25, or less. This may allow lithography to extend to thicknesses of greater than or about 300 nm, greater than or about 350 nm, greater than or about 400 nm, or more, without performing additional alignment key opening operations.

Additionally, some embodiments of the present technology may produce a bilayer hard mask, which may further limit the impact of incorporation of metal-materials, while providing improved selectivity with respect to materials being etched. For example, such as was previously explained with optional deposition operation 315, method 300 may initially include forming a plasma of one or more boron-containing precursors in the semiconductor processing region. The process may include maintaining the processing region free of a metal-containing dopant precursor during this initial process, which may initially deposit a boron-containing layer on the substrate 405. The first layer, which may be maintained metal-dopant free, may be formed to a first thickness on the substrate 405. Subsequently, after a first period of time to develop the thickness of the first layer, the dopant precursor may then be provided at optional operation 320. A second layer including a boron-doped material may then be deposited on the first layer of boron-containing film to produce a bilayer film or hard mask. The plasma and flow of the boron-containing precursor may be maintained during the process, with the addition of the dopant-containing precursor subsequent the first period of time. The deposition may then proceed for a second period of time until a desired thickness of the second layer, which may be the metal doped layer, may be provided.

The first period of time and the second period of time may be based on the desired thickness of the layers. For example, in some embodiments the first period of time may be less than or equal to the second period of time, where the produced bilayer may have an equal thickness of the two layers, or the second, doped layer may be thicker than the first layer. Accordingly, in some embodiments the second layer of the metal-doped boron-containing material may be greater than or about 25% of a thickness of the bilayer film, and the second layer may be greater than or about 30% of a thickness of the bilayer film, greater than or about 35% of a thickness of the bilayer film, greater than or about 40% of a thickness of the bilayer film, greater than or about 45% of a thickness of the bilayer film, greater than or about 50% of a thickness of the bilayer film, greater than or about 55% of a thickness of the bilayer film, greater than or about 60% of a thickness of the bilayer film, greater than or about 65% of a thickness of the bilayer film, greater than or about 70% of a thickness of the bilayer film, greater than or about 75% of a thickness of the bilayer film, greater than or about 80% of a thickness of the bilayer film, greater than or about 85% of a thickness of the bilayer film, greater than or about 90% of a thickness of the bilayer film, or more. By utilizing metal-doped mask materials according to embodiments of the present technology, improved selectivity may be afforded as discussed below which may facilitate production at future process nodes.

At optional operation 330, method 300 may include depositing one or more additional materials over the metal-doped boron-containing material 420. The one or more additional materials may form a stack of materials on the substrate 405. As illustrated in FIG. 4A, the one or more additional materials may include an oxide hardmask 425 deposited over the metal-doped boron-containing material 420. A carbon hardmask 430 may be deposited over the oxide hardmask 425. One or more anti-reflective coatings may be deposited over the carbon hardmask. The one or more anti-reflective coatings may include, but are not limited to, a dielectric anti-reflective coating 435, a bottom layer anti-reflective coating 440, or any other anti-reflective coating useful in semiconductor processing. A patterned photoresist material 445 may be deposited over the one or more anti-reflective coatings. The patterned photoresist material 445 may include one or more apertures 450 that expose the underlying anti-reflective coating, such as the bottom layer anti-reflective coating 440.

Figure 4B:
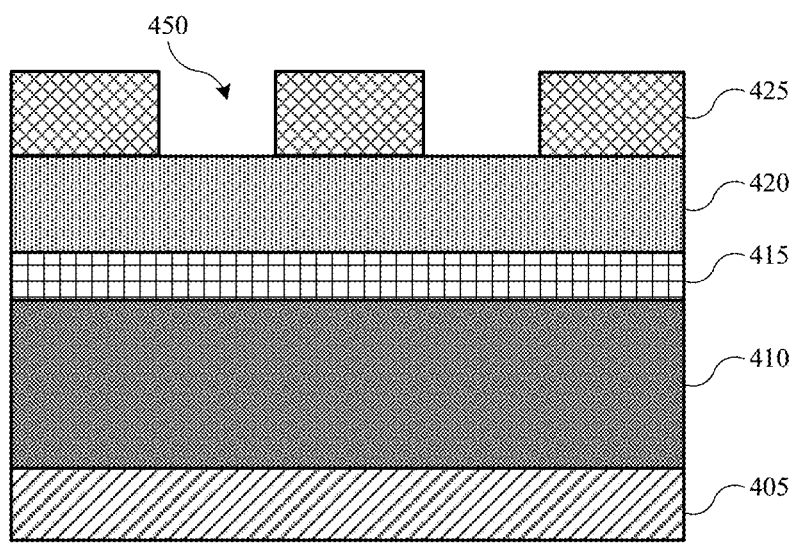

At optional operation 335, a pattern from the patterned photoresist 345 may be transferred through the one or more additional materials to the metal-doped boron-containing material 420, such as to expose the metal-doped boron-containing material 420. In embodiments, each layer of material between the patterned photoresist 445 and the metal-doped boron-containing material 420 may be sequentially patterned and removed to transfer a pattern through the one or more additional materials as illustrated in FIG. 4B. As illustrated in FIG. 4B, the oxide hardmask 425 may be patterned to transfer the pattern to expose the metal-doped boron-containing material 420.

Figure 4C:
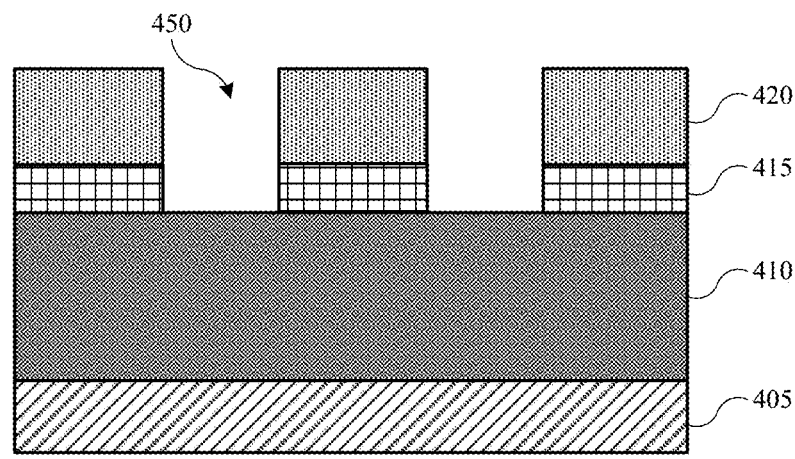

As illustrated in FIG. 4C, at operation 340, method 300 may include etching the metal-doped boron-containing material 420. Etching the metal-doped boron-containing material 420 may include providing a halogen-containing precursor, such as a chlorine-containing precursor and/or a bromine-containing precursor, to the processing region. In embodiments, the chlorine-containing precursor may be or include diatomic chlorine ($Cl_2$) or any other chlorine-containing precursor. The bromine-containing precursor may be or include hydrogen bromide (HBr) or any other bromine-containing precursor. Utilizing both a chlorine-containing precursor, such as diatomic chlorine ($Cl_2$), and a bromine-containing precursor, such as hydrogen bromide (HBr), may provide desired etch selectivity. Etching the metal-doped boron-containing material 420 may include forming plasma effluents of the one or more halogen-containing precursors, such as the chlorine-containing precursor and/or the bromine-containing precursor. The chlorine-containing precursor or plasma effluents thereof may selectively remove the exposed metal-doped boron-containing material 420 relative to the patterned oxide hardmask 425. Etching of the metal-doped boron-containing material 420 with the chlorine-containing precursor or plasma effluents thereof may form non-volatile by products, such as tungsten hexachloride ($WCl_6$) and/or boron trichloride ($BCl_3$). The etching at operation 340 may also etch the underlying silicon-carbon-and-nitrogen material 415, if present, and/or a portion of the underlying silicon-containing material 410. However, in order to maintain high selectivity, a flow of the chlorine-containing precursor may be halted once the underlying silicon-containing material 410 is exposed. As further described below, a different etch chemistry may be used to continue transferring the pattern to the underlying silicon-containing material 410.

While etching the metal-doped boron-containing material 420 at operation 340, intermittently delivering a silicon-containing precursor and/or an oxygen-containing precursor. During delivery of the silicon-containing precursor and/or the oxygen-containing precursor, the flow of chlorine-containing precursor may be paused or reduced. However, it is also contemplated that the flow of the chlorine-containing precursor may be maintained while delivery of the silicon-containing precursor and/or the oxygen-containing precursor. The silicon-containing precursor and/or the oxygen-containing precursor may react to form a passivation material on sidewalls of the metal-doped boron-containing material 420. While some embodiments may include co-flowing silicon-containing precursor and/or an oxygen-containing precursor to form the passivation material, other embodiments may sufficiently form the passivation material by flowing only one of the silicon-containing precursor or the oxygen-containing precursor. The passivation material may limit etching of the metal-doped boron-containing material 420 laterally to maintain apertures with a uniform opening size in the metal-doped boron-containing material 420. The passivation material may additionally increase selectivity during the removal. In embodiments, the silicon-containing precursor may be or include silicon tetrachloride ($SiCl_4$) or any other silicon-containing precursor. The oxygen-containing precursor may be or include molecular oxygen ($O_2$) or any other oxygen-containing precursor.

Figure 4D:
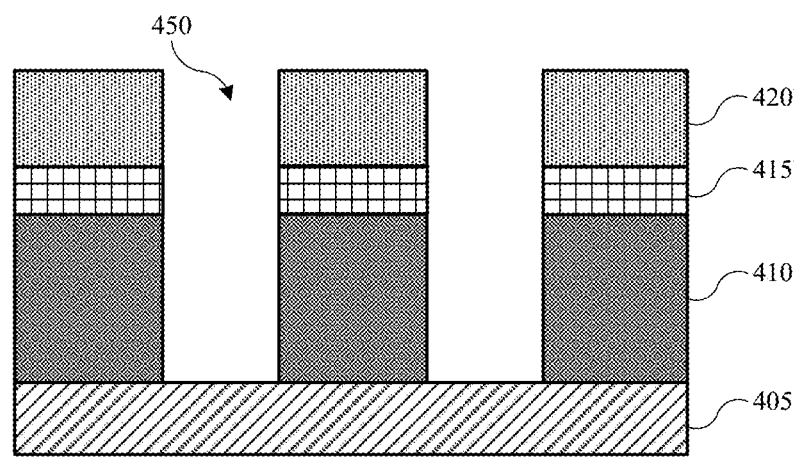

As illustrated in FIG. 4D, at operation 345, the silicon-containing 410 below the metal-doped boron-containing material 420 may be etched. Etching the silicon-containing 410 may include providing a fluorine-containing precursor to the processing region. An oxygen-containing precursor may be provided with the fluorine-containing precursor. In embodiments, the fluorine-containing precursor may be or include a fluorocarbon ($C_xF_y$) or any other fluorine-containing precursor, such as a fluorine-carbon-and-hydrogen-containing precursor. The oxygen-containing precursor may be or include molecular oxygen ($O_2$) or any other oxygen-containing precursor. Etching the silicon-containing material 410 relative to the metal-doped boron-containing material 420 may include forming plasma effluents of the fluorine-containing precursor and the oxygen-containing precursor.

The fluorocarbon precursor and the oxygen-containing precursor, and plasma effluents thereof, may simultaneously passivate sidewalls of the metal-doped boron-containing material 420 and etch the underlying silicon-containing material 410. Specifically, the generation of plasma may separate fluorine and/or carbon from the fluorocarbon precursor. The fluorine may serve as the etchant species and the carbon may combine with the oxygen-containing precursor to form carbon monoxide (CO) or carbon dioxide ($CO_2$), which may be removed from the processing region. Simultaneously, the fluorocarbon may passivate the sidewalls of the metal-doped boron-containing material 420. The metal in the metal-doped boron-containing material, such as tungsten, may further facilitate the fluorine radical formation in the generated plasma effluents. The increased fluorine radical formation may enhance the etch rate of the underlying silicon-containing material 410. Additionally, generated tungsten fluoride byproduct materials may also contribute to passivation of the sidewalls of the metal-doped boron-containing material. This passivation, along with the passivation from the fluorocarbon, may reduce clogging in the apertures 450 patterned metal-doped boron-containing material 420 as well as protect sidewalls of the metal-doped boron-containing material 420 from being etched.

In some embodiments, the metal-doped boron-containing material 420 may be characterized by an etch selectivity relative to underlying silicon-containing material 410, such as oxide and/or nitride materials, such that the underlying materials may etch at a rate that is greater than or about 2 times the rate at which the metal-doped boron-containing material 420 may etch. Additionally, the silicon-containing material 410, such as silicon oxide or silicon nitride, may etch at a rate that is greater than or about 3.0 times the rate at which the metal-doped boron-containing material 420 may etch, such as greater than or about 3.5 times, greater than or about 4.0 times, greater than or about 4.5 times, greater than or about 5.0 times, greater than or about 5.5 times, greater than or about 6.0 times, greater than or about 6.5 times, greater than or about 7.0 times, greater than or about 7.5 times, greater than or about 8.0 times, greater than or about 8.5 times, greater than or about 9.0 times, greater than or about 9.5 times, greater than or about 10.0 times or more. This may be at least twice as selective to the underlying films compared to other hardmask materials, such as amorphous silicon. Consequently, by increasing the etch selectivity relative to underlying films, the metal-doped boron-containing material 420 may be formed to a reduced thickness, which may improve or maintain transparency of the film despite incorporation of the metal material.

The metal-doped boron-containing materials 420 according to the present technology may increase the etch rate of the underlying silicon-containing material 410. In embodiments, the silicon-containing material 410 may be etched at an etch rate of greater than or about 4400 Å/min, such as greater than or about 4450 Å/min, greater than or about 4500 Å/min, greater than or about 4550 Å/min, greater than or about 4600 Å/min, greater than or about 4650 Å/min, greater than or about 4700 Å/min, greater than or about 4750 Å/min, greater than or about 4800 Å/min, or more. While not intending to be bound by any particular theory, the metal in the metal-doped boron-containing material 420 may catalyze the formation of etchant radicals, such as fluorine radicals. Additionally, the etchant, such as fluorine, may interact with the metal-doped boron-containing material 420 to form metal fluoride material. The metal fluoride material may accumulate around the metal-doped boron-containing material 420 and serve as a protection layer. The metal fluoride material, such as $WF_x$ material in the case of a tungsten-doped boron material, may serve as a better protection material than, for example, $CF_x$ material found in conventional etch operations without the presence of a metal dopant. Furthermore, the metal fluoride material, such as $WF_x$ material, may at least partially dissociate after a period of time and provide additional fluorine radicals to the etch the underlying silicon-containing material 410. These additional fluorine radicals may further increase the etch rate of the silicon-containing material 410. In general, the etching may etch a portion of the metal-doped boron-containing material 420, and the metal in the portion of the metal-doped boron-containing material 420 that is etched may increase an etch rate of the silicon-containing material 410 as well as an etch selectivity. After the silicon-containing material 410 is etched to a desired depth, such as to expose the substrate 405, a flow of the fluorine-containing precursor and a flow of the oxygen-containing precursor may be halted.

Figure 4E:
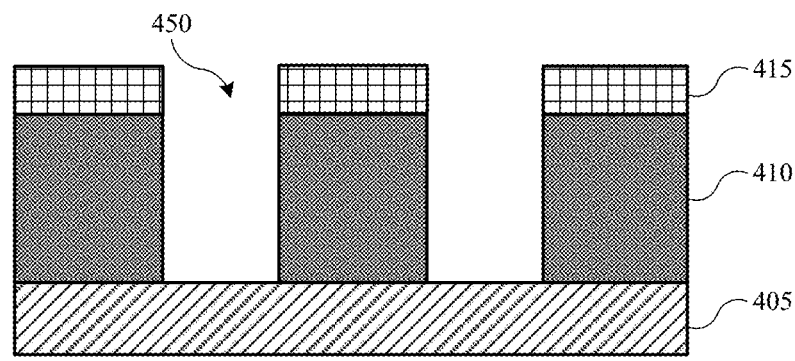

As illustrated in FIG. 4E, at operation 350, method 300 may include removing the metal-doped boron-containing material 420 from the substrate 405. Removing the metal-doped boron-containing material 420 may include providing a halogen-containing to the processing region. The halogen-containing precursor may include, for example, chlorine and/or bromine. In embodiments, the halogen-containing precursor may be or include, for example, diatomic chlorine ($Cl_2$), hydrogen bromine (HBr), or any other halogen-containing precursor. In embodiments, plasma effluents of the halogen-containing precursor may be generated during the removing or stripping of the metal-doped boron-containing material 420. In embodiments, molecular oxygen ($O_2$) may be added during the stripping operation of the metal-doped boron-containing material 420 to control the stripping and prevent undesirable removal of neighboring materials such as the silicon-carbon-and-nitrogen material 415 if present.

During operations 340-350, as previously discussed, plasma effluents of the various precursors may be generated. During each operation, a source power and/or bias power may be applied to enhance etching or removal. In one exemplary embodiment, the source power may operate at 13.56 MHz and the bias power may operate at 2 MHz although any other frequencies may be used. In embodiments, the source power may be operated at less than or about 5,000 W. The bias power may be operated at less than or about 10,000 V. In embodiments, during operations 340 and 350, the bias power may be maintained at less than or about 2,500 V, whereas during operation 345, the bias power may be maintained at a higher level, such as greater than or about 2,500 V.

In embodiments, one or more of operations 340-350 may be operated with varying amounts of source power and bias power to alter the affect of the precursors with the substrate 405 and the materials present on the substrate. For example, during a first period of time of any of operations 340-350, the source power may be "on" and the bias power may be "off" or "on" at a low level. During a first period of time, sidewalls of the silicon-containing material 410 and/or the metal-doped boron-containing material 420 may be passivated and etching of the material may be limited. During a second period of time, the bias power may be "on" or increased from the first period of time. Additionally, the source power may be maintained or decreased during the second period of time. By increasing the bias power, bombardment and directionality of the plasma effluents may be increased. The increase in bombardment and directionality may result in deeper etching of the silicon-containing material 410 and/or the metal-doped boron-containing material 420. During a third period of time, both the source power and the bias power may be "off" to allow for byproduct to be removed from the processing region. By removing byproduct with the source power and the bias power "off", unintentional clogging may be prevented. The three periods of time may be repeated in various orders during each of operations 340-350. Additionally, the source power and the bias power may be provided at different RF powers and voltages, respectively, throughout operations 340-350 or sequences within one of operations 340-350.

In embodiments, a temperature may be varied during operations 340-350. For example, during operations 340 and 350, wherein the metal-doped boron-containing material 420 is patterned or removed, respectively, the substrate 405 may be maintained at a temperature of less than or about 400° C., and may be maintained at a temperature of less than or about 375° C., less than or about 350° C., less than or about 325° C., less than or about 300° C., less than or about 275° C., less than or about 250° C., less than or about 225° C., less than or about 200° C., less than or about 175° C., less than or about 150° C., less than or about 125° C., less than or about 100° C., less than or about 75° C., less than or about 50° C., less than or about 25° C., less than or about 0° C., or lower. During operation 345, wherein the silicon-containing 410 below the metal-doped boron-containing material 420 may be etched, substrate 405 may be maintained at a temperature of less than or about 150° C., and may be maintained at a temperature of less than or about 125° C., less than or about 100° C., less than or about 75° C., less than or about 50° C., less than or about 25° C., less than or about 0° C., less than or about −25° C., less than or about −50° C., less than or about −75° C., less than or about −100° C., less than or about −125° C., less than or about −150° C., or lower.

During operations 340 and 350, metal-containing byproducts may have relatively high boiling or sublimation points, such as greater than or about 100° C., greater than or about 125° C., greater than or about 150° C., or higher. By operating at higher temperatures, such as greater than or about 150° C., greater than or about 200° C., or higher, etch rates of the metal-doped boron-containing material 420 may increase and/or selectivity relative to the silicon-containing 410 may increase. Increased etch rate and/or selectivity may also allow for critical dimensions to be more uniformly maintained during operation 340. Additionally, higher temperature may afford easier pump out of etch byproducts. During operation 345, the temperature may be maintained lower than the temperature during operation 340 and 345. By operating at lower temperatures, such as less than or about 150° C. or lower, sidewalls of the silicon-containing 410 and/or sidewalls of the metal-doped boron-containing material 420 may be protected.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
depositing a metal-doped boron-containing material on a substrate disposed within a processing region of a semiconductor processing chamber, wherein the metal-doped boron-containing material comprises a metal dopant comprising tungsten, and wherein the substrate comprises a silicon-containing material;
depositing one or more additional materials over the metal-doped boron-containing material, wherein the one or more additional materials comprise a patterned photoresist material;
transferring a pattern from the patterned photoresist material to the metal-doped boron-containing material;
etching the metal-doped boron-containing material with a chlorine-containing precursor;
etching the silicon-containing material with a fluorine-containing precursor, wherein the metal dopant enhances an etch rate of the silicon-containing material; and
removing the metal-doped boron-containing material from the substrate with a halogen-containing precursor.

2. The semiconductor processing method of claim 1, wherein a metal dopant concentration within the metal-doped boron-containing material is maintained at less than or about 80 at. %.

3. The semiconductor processing method of claim 1, wherein the one or more additional materials comprise:
   an oxide hardmask deposited over the metal-doped boron-containing material;
   a carbon hardmask deposited over the oxide hardmask; and
   one or more anti-reflective coatings deposited over the carbon hardmask, wherein the patterned photoresist material overlies the one or more anti-reflective coatings.

4. The semiconductor processing method of claim 1, wherein the chlorine-containing precursor comprises diatomic chlorine ($Cl_2$).

5. The semiconductor processing method of claim 1, further comprising:
   during etching of the metal-doped boron-containing material, applying a plasma power to the processing region.

6. The semiconductor processing method of claim 1, further comprising:
   during etching of the metal-doped boron-containing material, intermittently delivering a silicon-containing precursor and an oxygen-containing precursor to form a passivation material on sidewalls of the metal-doped boron-containing material.

7. The semiconductor processing method of claim 6, wherein:
   the silicon-containing precursor comprises silicon tetrachloride ($SiCl_4$); or
   the oxygen-containing precursor comprises molecular oxygen ($O_2$).

8. The semiconductor processing method of claim 1, wherein the fluorine-containing precursor comprises a fluorocarbon.

9. The semiconductor processing method of claim 1, wherein the metal dopant facilitates fluorine radical formation during etching of the silicon-containing material.

10. The semiconductor processing method of claim 1, wherein the halogen-containing precursor comprises diatomic chlorine ($Cl_2$) or hydrogen bromide (HBr).

11. A semiconductor processing method comprising:
    depositing a metal-doped boron-containing material over a silicon-containing material overlying a substrate disposed within a processing region of a semiconductor processing chamber, wherein the metal-doped boron-containing material comprises a metal;
    delivering a fluorine-containing precursor and an oxygen-containing precursor to the processing region of the semiconductor processing chamber;
    forming a plasma of the fluorine-containing precursor and the oxygen-containing precursor within the processing region of the semiconductor processing chamber; and
    etching the silicon-containing material, wherein the etching removes a portion of the metal-doped boron-containing material, and wherein the metal increases an etch rate of the silicon-containing material.

12. The semiconductor processing method of claim 11, wherein the metal-doped boron-containing material further comprises one or more of tungsten, molybdenum, titanium, aluminum, cobalt, ruthenium, tantalum, hafnium, zirconium, silicon, carbon, or nitrogen.

13. The semiconductor processing method of claim 11, wherein the metal-doped boron-containing material further comprises tungsten.

14. The semiconductor processing method of claim 11, further comprising:
    depositing a photoresist material over the metal-doped boron-containing material;
    patterning the photoresist material; and
    transferring a pattern from the patterned photoresist material to the metal-doped boron-containing material.

15. The semiconductor processing method of claim 11, wherein the fluorine-containing precursor comprises a fluorocarbon, and wherein the fluorine-containing precursor passivates sidewalls of the metal-doped boron-containing material.

* * * * *